United States Patent
Hunt et al.

(10) Patent No.: US 10,360,771 B2
(45) Date of Patent: Jul. 23, 2019

(54) ALERT PROCESSING

(71) Applicant: INTERNATIONAL BUSINESS MACHINES CORPORATION, Armonk, NY (US)

(72) Inventors: Hamish C. Hunt, Ashford (GB); Nicholas K. Lincoln, Middle Wallop (GB); Christopher J. Poole, Romsey (GB); Mark A. Woolley, Winton Close (GB)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 22 days.

(21) Appl. No.: 15/378,566

(22) Filed: Dec. 14, 2016

(65) Prior Publication Data
US 2018/0165922 A1 Jun. 14, 2018

(51) Int. Cl.
*G08B 31/00* (2006.01)
*G08B 3/10* (2006.01)
(Continued)

(52) U.S. Cl.
CPC .......... *G08B 3/10* (2013.01); *G08B 13/1672* (2013.01); *G08B 25/10* (2013.01); *G08B 31/00* (2013.01);
(Continued)

(58) Field of Classification Search
CPC ............ H04R 2460/01; H04R 2430/01; H04R 2499/11; G06F 3/165; G06F 3/167;
(Continued)

(56) References Cited

U.S. PATENT DOCUMENTS

| 8,842,005 | B1 | 9/2014 | Mittal | |
|---|---|---|---|---|
| 9,191,744 | B2 | 11/2015 | Anderson | |
| 2014/0079014 | A1* | 3/2014 | Lee | H04W 48/18 370/329 |
| 2015/0222977 | A1* | 8/2015 | Angel, Jr. | H04R 1/105 381/74 |

(Continued)

FOREIGN PATENT DOCUMENTS

| EP | 2966642 A2 | 1/2016 |
|---|---|---|
| WO | WO2015127194 A1 | 8/2015 |

OTHER PUBLICATIONS

Leclair, "One Llama App Alerts Users to Important Sounds While Wearing Headphones", www.Newatlas.com, 2014.
(Continued)

*Primary Examiner* — Benyam Haile
(74) *Attorney, Agent, or Firm* — William Kinnaman, Esq.; Kevin P. Radigan, Esq.; Heslin Rothenberg Farley & Mesiti P.C.

(57) ABSTRACT

Controlling transmission of an alert to a user of a device providing audio. An event which is identified as an alert is detected, and it is determined that the alert is a notifiable alert. A movement sensor associated with the user is monitored during a time period after detection of the notifiable alert. During the time period, it is determined whether movement of the sensor has deviated from a prior pattern of movement. A deviation indicates a user response to the alert. An action to alert the user is taken if the movement of the sensor during the time period has not deviated from the prior pattern of movement indicating that the user has not responded to the original alert. There is no such action if the movement of the sensor has deviated from the prior pattern of movement indicating a user response to the alert.

20 Claims, 5 Drawing Sheets

(51) Int. Cl.
   H04R 1/10      (2006.01)
   H03G 3/32      (2006.01)
   G08B 13/16     (2006.01)
   G08B 25/10     (2006.01)
   G06F 3/16      (2006.01)

(52) U.S. Cl.
   CPC ............ *H03G 3/32* (2013.01); *H04R 1/1041*
        (2013.01); *G06F 3/165* (2013.01); *G06F 3/167*
        (2013.01); *H04R 1/1083* (2013.01); *H04R*
        *2420/07* (2013.01); *H04R 2430/01* (2013.01);
        *H04R 2460/01* (2013.01)

(58) Field of Classification Search
   CPC ............... G08B 21/02; G08B 31/00; G10K
        2210/1081; G10L 25/84; H03G 3/32;
        H03G 3/342; H04M 1/72538
   See application file for complete search history.

(56) References Cited

U.S. PATENT DOCUMENTS

| | | | |
|---|---|---|---|
| 2016/0292994 A1* | 10/2016 | Grimme | H04M 1/72569 |
| 2017/0118660 A1* | 4/2017 | Griffin | H04W 24/02 |
| 2017/0328997 A1* | 11/2017 | Silverstein | G01S 13/886 |
| 2018/0012462 A1* | 1/2018 | Heitz, III | G08B 13/19606 |

OTHER PUBLICATIONS

"Sundae Electronics Launches Headphone Gadget That Alerts Users to Important Outside Sounds", www.Crowdfundingpr.org, Dec. 21, 2015.

Pu, Qifan et al.,"Whole-Home Gesture Recognition Using Wireless Signals", MobiCom 13 Proceedings of the 19th Annual International Conference on Mobile Computing & Networking, Sep. 2013, pp. 1-12.

Baronchelli, Andrea et al., "Levy Flights in Human Behavior and Cognition," Chaos, Solitons & Fractals, 56, Jul. 2013, pp. 101-105.

* cited by examiner

ALERT PROCESSING

BACKGROUND

Listening to music or other audio material through headphones may reduce the listener's awareness of external sounds indicative of events in their surroundings, because the music or other audio masks the external sounds. Particularly this may be the case where the headphones have noise-cancelling functionality. This may be a problem if an important event occurs, for example the sounding of a doorbell, which might be termed an alert.

To address this problem, various solutions have been provided which detect an ambient noise, and if the noise volume is above a certain threshold, interrupt the audio to the listener's headphones so that the noise can be heard by the listener. Such solutions cannot detect that a listener has responded to an alert. If an alert repeats, then the interruption of the audio will also be repeated.

SUMMARY

Shortcomings of the prior art are overcome and additional advantages are provided through the provision of a computer-implemented method of controlling transmission of an alert to a user of a device providing audio. The computer-implemented method comprises: detecting an event comprising the alert; determining that the alert meets user notification criteria and is therefore a notifiable alerts; monitoring a movement sensor associated with the user during a time period after detection of the notifiable alert; determining during the time period whether movement of the movement sensor has deviated from a prior pattern of movement, a deviation being indicative of a user response to the alert; based on determining the movement of the movement sensor during the time period has not deviated from the prior pattern of movement, taking an action to alert the user to the notifiable alert; and based on determining the movement of the movement sensor has deviated from the prior pattern of movement, taking no action.

Computer program products and devices relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

Embodiments of the present invention will now be described, by way of example only, with reference to the following drawings in which.

DETAILED DESCRIPTION

Figures 1, 2:
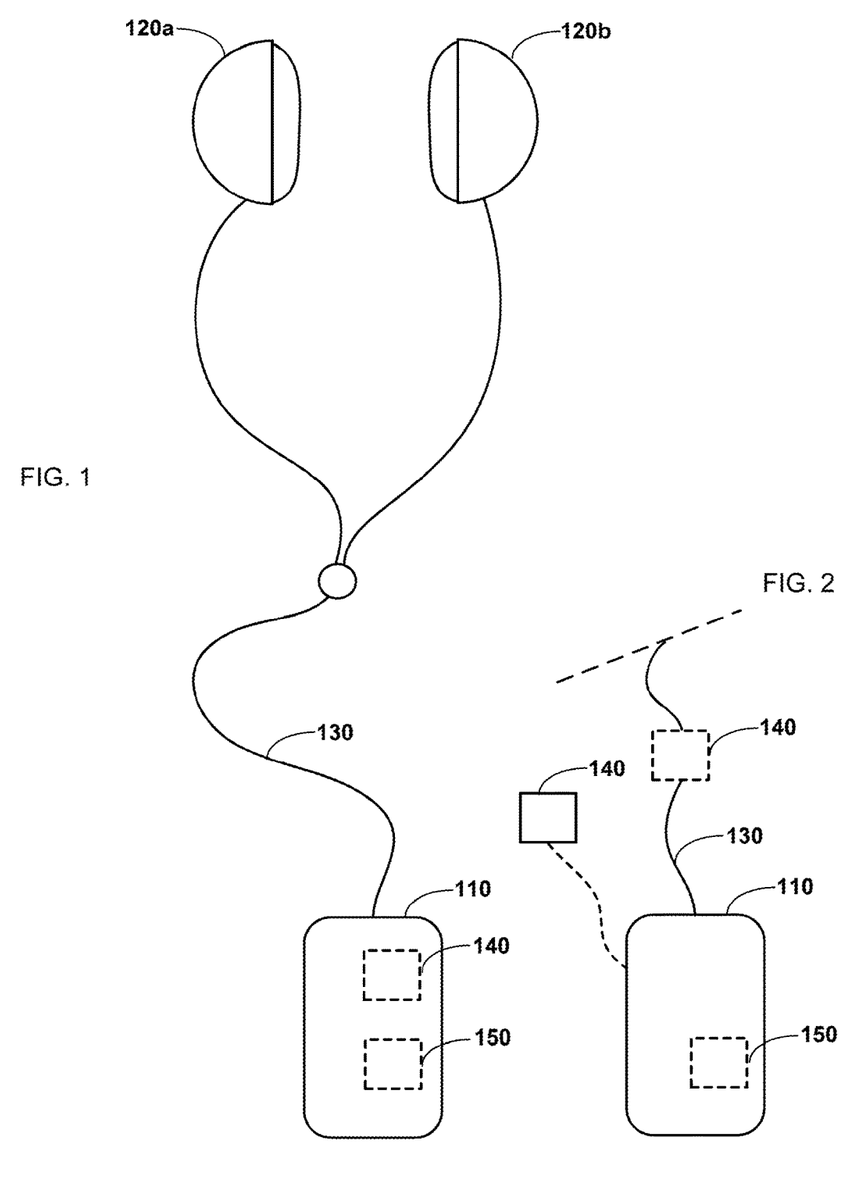
FIG. 1 depicts a device comprising an audio source according to embodiments of the present invention.
FIG. 2 depicts alternative arrangements according to embodiments of the present invention.

FIG. 1 illustrates a device according to embodiments of the invention. Device 110 provides audio, such as music, to a user of the device. Device 110 may be a personal device such as a cellphone, smartphone or music player, or any other suitable device comprising computer processing functionality or computer processing and communications functionality. Device 110 comprises audio source 150. The user listens to audio produced by audio source 150 through headphones 120a, 120b which may be linked to the device by audio lead 130. Alternatively, headphones 120a, 120b may be linked to the device by wireless communication, for example using a short range wireless protocol such as Bluetooth®.

Device 110 further comprises an activity tracker 140. Activity tracker 140 monitors movement of a device user as recorded by movement sensors as described below. Activity tracker 140 may be integral with device 110 as shown in FIG. 1. Alternatively, a separate device may comprise activity tracker 140 as shown in FIG. 2. In this case the separate device comprising activity tracker 140 may be, for example, a wearable device or a constituent part of a further device, which is in communication with device 110 by wired or wireless communication. This wireless communication may employ a short range wireless communications protocol such as Bluetooth®, for example. Activity tracker 140 may alternatively be part of a separate device positioned in headphone lead 130, as shown bounded by the dashed line in FIG. 2.

Figure 3:
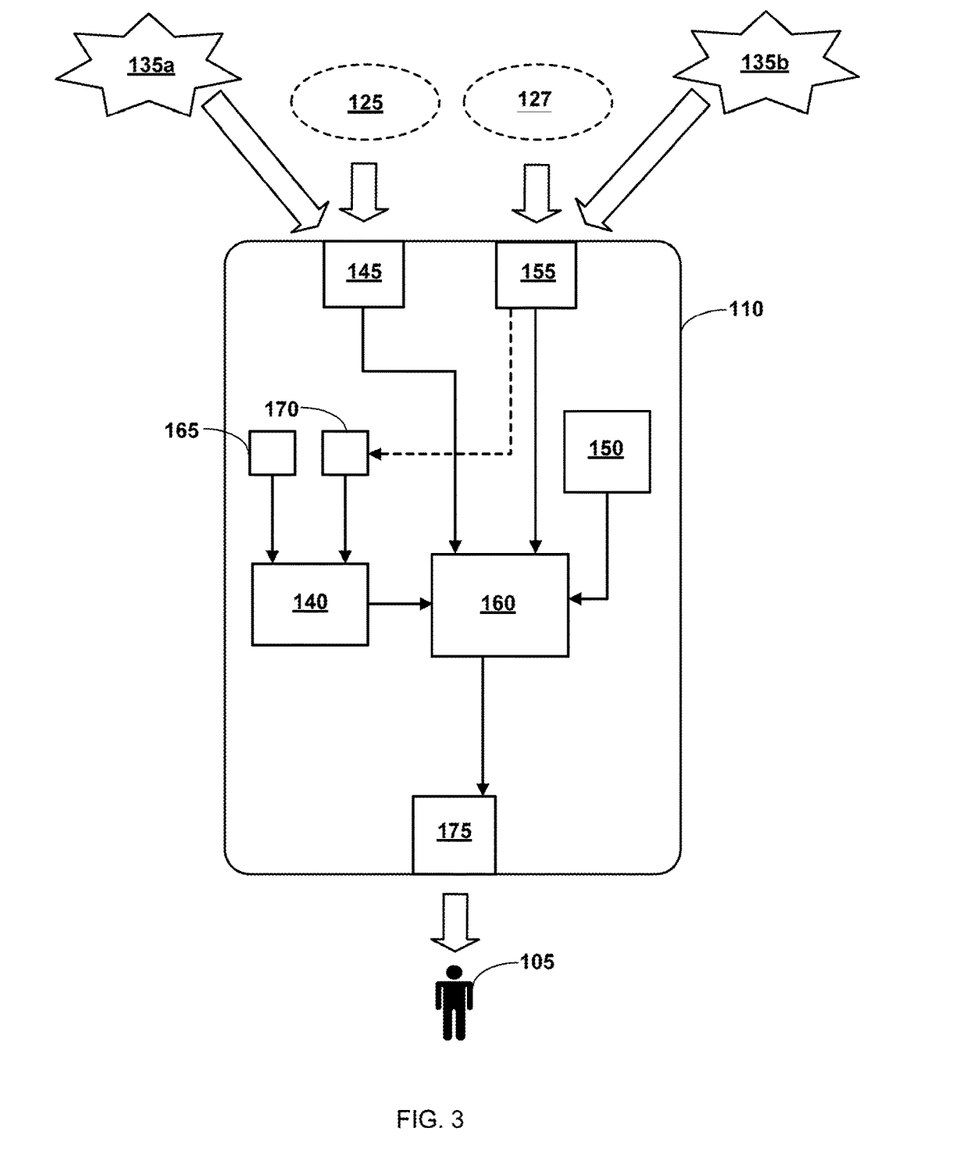
FIG. 3 depicts a device comprising an alert processor according to embodiments of the present invention.

FIG. 3 illustrates a diagrammatic representation of a device 110 in more detail, according to an embodiment of the invention. Device 110 comprises audio source 150. Audio source 150 may comprise any suitable audio source, for example a digital audio file music player or a radio receiver. Audio source 150 communicates audio to audio output 175 for user 105. Audio output 175 may comprise headphones 120a, 120b of FIG. 1, for example.

Device 110 comprises a sensor or sensors of external environmental signals which might include events comprising alerts. In an embodiment, a sensor comprises a microphone 145 which may comprise the standard microphone of device 110. In a further embodiment, a sensor comprises a sensor of wireless network communications signals 155 which may comprise the device antenna of device 110. Microphone 145 detects ambient environmental sounds 125. Wireless network communications sensor 155 detects ambient wireless traffic 127. This wireless traffic may comprise wireless signals from a wireless connection to a wireless enabled local area network router, for example.

Device 110 further comprises alert processor 160. Alert processor 160 monitors signals from environmental sensors, comprising for example microphone 145 and wireless network communications sensor 155. Alert processor 160 comprises computer processing logic functionality to detect an event comprising an alert in the environment of the device, and to determine whether or not it meets user notification criteria as a notifiable alert, i.e. is suitable for transmission to user 105. In the case of ambient environmental noise detected by microphone 145, this may be a sound above a notification threshold volume, for example alert A 135a. Alert A may be an alarm sound, such as a doorbell or fire alarm. In the case of wireless network communications sensor 155 this may be alert B 135b. Alert B may be an alert signal from a device connected to a wired or wireless network, for example a building local area network. The local area network may include a local area network router connectable to device 110 via wireless communications signals. In this case the alert signal might be a signal matching a notification format, for example an alarm from a remote device wirelessly connected to the building local area network.

Device 110 may further comprise an activity tracker 140. Activity tracker 140 is operable for detecting movement of device 110 carried by user 105 indicative of movement of user 105. Activity tracker 140 is further operable for communicating detected activity to alert processor 160. Activity tracker 140 comprises sensors, for example accelerometer 165 and wireless communications signal observer 170. Accelerometer 165 may comprise device 110 accelerometer, or an accelerometer integral with activity tracker 140. Wireless communications signal observer 170 may comprise a detector which detects movement by observing changes in ambient wireless signal characteristics indicative of movement relative to the wireless signal source. Wireless communications signal observer 170 may receive wireless signals from device antenna 155.

Figure 4:
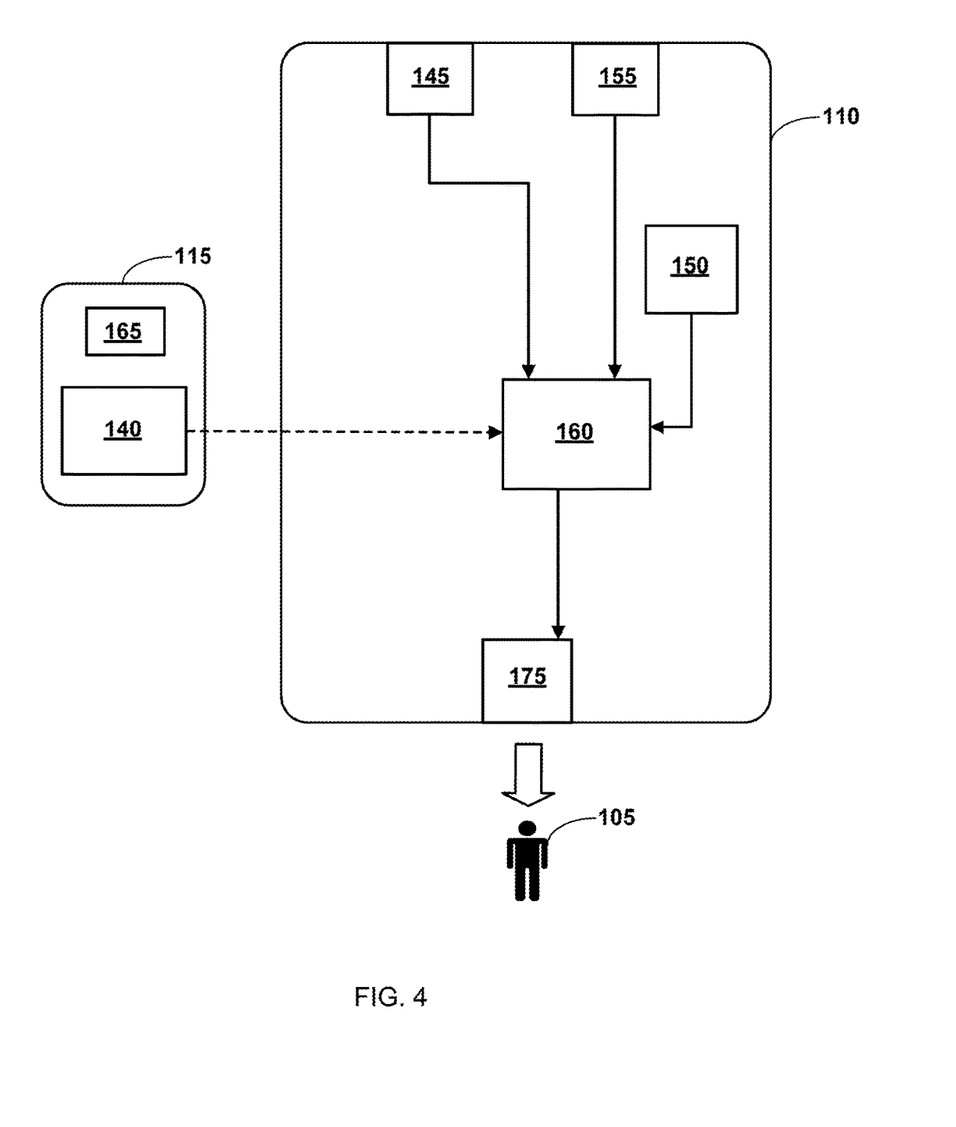
FIG. 4 depicts a device comprising an alert processor and a separate device comprising an activity tracker according to embodiments of the invention.

FIG. 4 illustrates another embodiment of the invention. In this embodiment, a further device 115 comprises activity tracker 140. The further device 115 may be a fitness tracker, smart watch, or similar device attached to or carried by user 105 and connected by wireless or wired connection to device 110. Device 115 comprises a movement sensor, for example an accelerometer 165. Device 115 is connected by wireless or wired communication to device 110 and communicates movement sensed by movement sensor, for example accelerometer 165, to device 110. Other parts of device 110 of FIG. 4 are not shown for clarity but may be as in FIG. 3.

In other embodiments activity tracker 140 is integral with headphones 120*a*, 120*b*, for example attached in headphone lead 130 as shown in FIG. 2. In other embodiments an external device 115 attached to or carried by the user, for example a fitness tracker or watch, comprises sensors which communicate detected movement to a separate activity tracker 140 by wireless communication. In this case activity tracker 140 may be part of device 110. In one embodiment, user movement is monitored by an external device such as device 115, and user 105 has headphones wirelessly receiving audio (for example using a short range wireless protocol such as Bluetooth®) from device 110. In this embodiment, device 110 may be a stationary or fixed device. The skilled person will appreciate that other arrangements of sensors, activity tracker and device 110 are possible without departing from the scope of the invention.

Activity tracker 140, for example integral with device 110 or included in a device 115 separately attached to or carried by user 105, may continually monitor movement of sensors, indicative of user 105 movement. This sensed movement may be used by alert processor 160 to build a model of a background pattern of movement of sensors communicating with activity tracker 140 indicative of a background pattern of movement of user 105.

Figure 5:
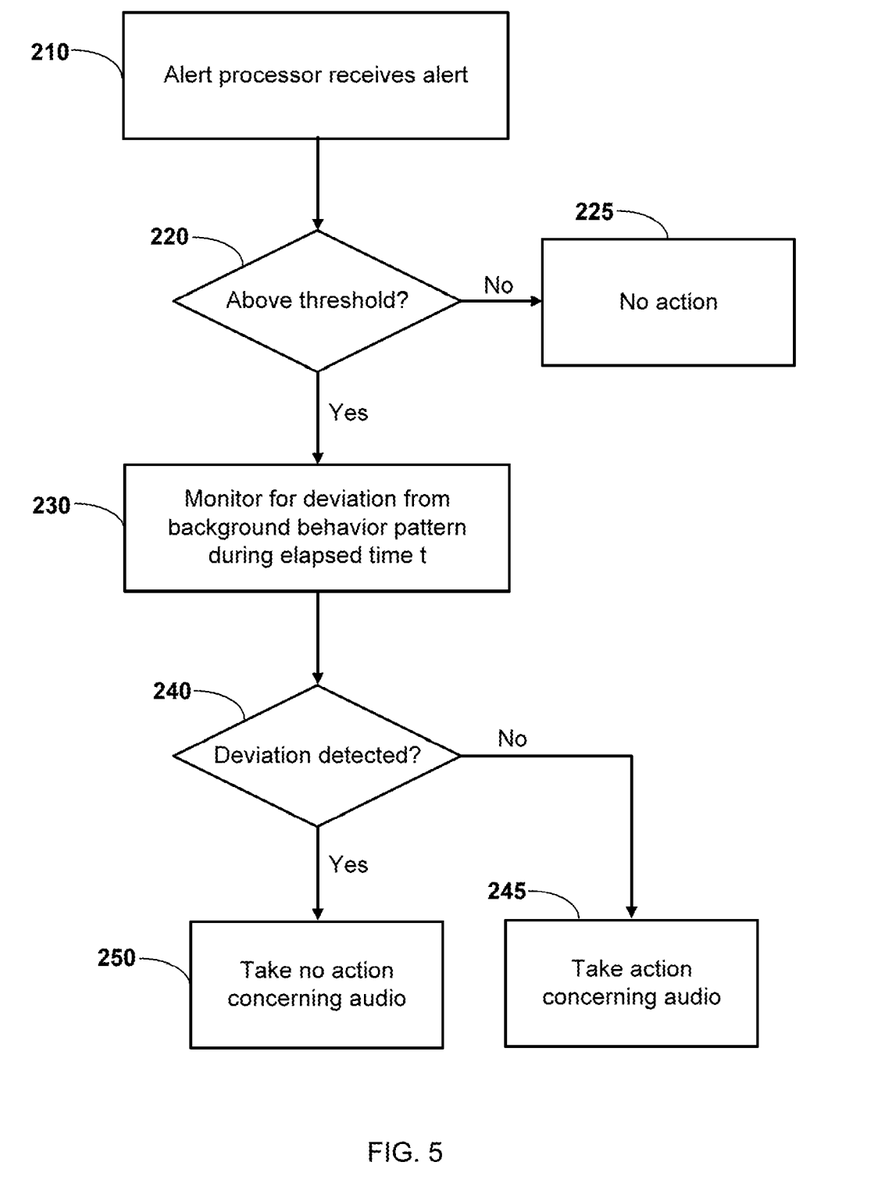
FIG. 5 depicts a method of operation of a device according to embodiments of the present invention.

Operation of a method according to embodiments of the invention will now be described with reference to the flowchart of FIG. 5 which should be read together with FIGS. 3 and 4. At step 210, alert processor 160 receives an event in the environment of device 110 comprising an alert, for example alert A 135*a* or alert B 135*b*. At step 220, processing logic of alert processor 160 determines if the alert meets user notification criteria and so is a notifiable alert. In the case of alert A 135*a* it determines if the volume of the sound detected is greater than a notification threshold. In the case of alert B 135*b* decision logic of alert processor 160 determines if an alert has occurred matching an alert notification format. If it determines that a notifiable alert has occurred it deems the notification threshold exceeded.

If the alert signal is not above the notification threshold, processing moves to 225 and no action is taken. If the alert signal is above the notification threshold, the alert is a notifiable alert. Processing moves to 230 at which processing logic of alert processor 160 starts a timer and monitors activity tracker 140 for signals indicative of user movement activity during a set time t after start of the timer. Time t may be set as being an appropriate time during which a response to an alert from user 105 might be expected to occur.

Alert processor 160 determines during time t at step 240 if there has been a deviation from an expected background pattern of movement of activity tracker 140. Such a deviation indicates that user 105 has moved to respond to the alert, for example a doorbell sounding. If alert processor 160 detects a deviation from the expected movement pattern at any point during time t, it determines that user 105 has responded to the alert. Processing moves to step 250, and alert processor 160 takes no further action. User 105 can continue to listen to the uninterrupted audio. If a deviation is not detected after time t has elapsed, alert processor 160 determines that user 105 has not responded to the alert. Processing moves to step 245 at which alert processor 160 takes an action concerning the audio.

In an embodiment, the action is that alert processor 160 interrupts the audio signal to audio output 175 and replaces it with an alert signal. The alert signal may be an alert sound relayed to audio output 175. The alert sound may be a recording of an original alert sound if this was an audible alert (such as a doorbell), or it may be a predetermined alert sound of alert processor 160 of device 110, for example. In another embodiment, audio output 175 comprises noise-cancelling headphones and the further action is the disabling of noise-cancelling. Alternatively, determination of the alert not having been responded to may cause alert processor 160 to reduce audio volume, or disable audio from audio source 150 until there is a user action to restore or enable it again. The skilled person will appreciate that other actions are possible without departing from the scope of aspects of the invention.

An embodiment of the invention provides a computer implemented method for controlling transmission of an alert to a user of a device providing audio. The method comprises detecting an event in the environment which may be characterized as an alert, i.e., something which may potentially be of interest to the user of the device. The method further comprises determining whether or not the alert meets user notification criteria, i.e. whether or not it should be brought to the attention of the user and so is a notifiable alert. The method further comprises determining during an elapsed time period whether or not movement of movement sensors communicating with an activity tracker deviate from a prior pattern of movement, indicating a user response to the notifiable alert. If the answer is yes, no further action is taken. If the answer is no, an action is taken to alert the user to the detected notifiable alert. The action may take a number of forms as detailed above.

Implementation of aspects of the invention includes firstly the detection of movement of sensors communicating with an activity tracker 140, and secondly the correct determination by an alert processor 160 of a deviation of a movement pattern from a known or expected movement pattern.

In an embodiment, movement of a sensor communicating with activity tracker 140 is detected using signals from a sensor comprising an accelerometer of activity tracker 140 or of device 110. Modern smartphones and other devices such as fitness trackers and smart watches have integral accelerometers which may be used to detect movement of the device, such as accelerometer 165 of device 110. A large movement of the sensor communicating with activity tracker 140 can be detected by sensor comprising accelerometer 165, registered by activity tracker 140 and transmitted to alert processor 160.

In another embodiment, movement of activity tracker 140 is detected by measuring changes in ambient wireless signals. In the embodiment, a sensor communicating with activity tracker 140 comprises a wireless signal observer 170 of wireless network communications signals. If activity tracker 140 is integral with device 110, wireless signal observer 170 may receive wireless signals from the antenna 155 of device 110. It is possible to detect the movement of a wireless receiver relative to wireless sources by analyzing the resultant Doppler shifts at the wireless receiver. Such a method is described in "Whole-Home Gesture Recognition Using Wireless Signals", by Qifan Pu et al, University of Washington, which is hereby incorporated herein by reference in its entirety. In the paper, the technique is used to detect human gestures. A similar technique may be used to detect similar shifts in received wireless signals when a wireless receiver, such as may be included in device 110, is moved.

In a further embodiment, movement is detected using a combination of signals from a sensor comprising an accelerometer, such as that of device 110 and changes to ambient wireless signals, in other words a combination of the techniques described in relation to the two previously described embodiments.

Figure 6:
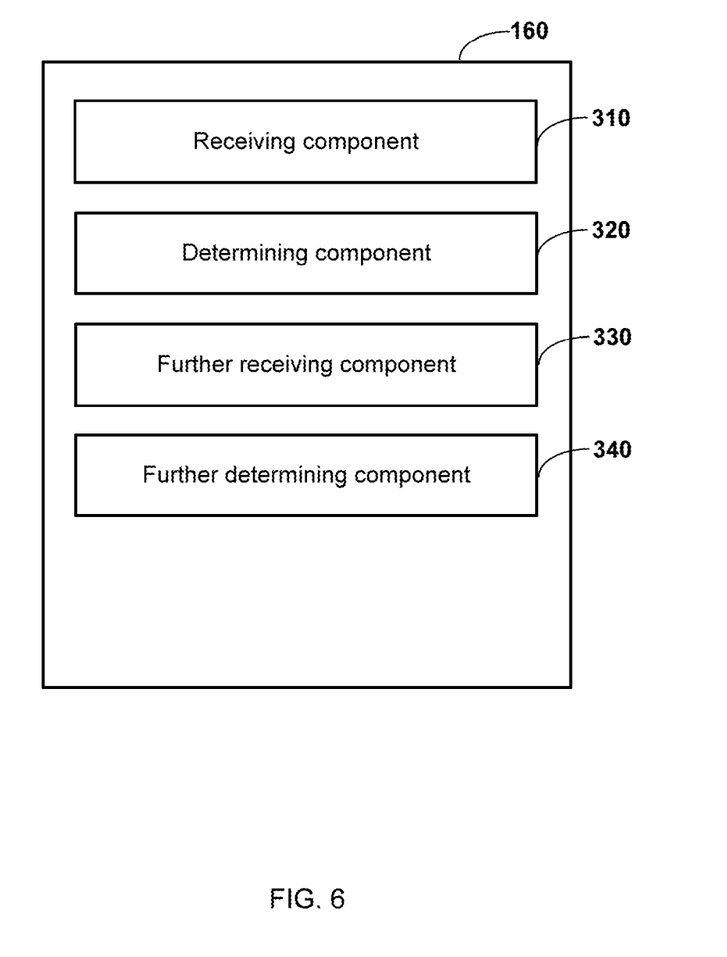
FIG. 6 depicts an alert processor according to embodiments of the present invention.

FIG. 6 illustrates constituent parts of an alert processor 160 according to an embodiment of the present invention. Alert processor 160 may be a constituent component of device 110 as described above. Alert processor 160 comprises a receiving component 310 for receiving a detected event comprising an alert. Alert processor 160 further comprises determining component 320 for determining whether or not the alert meets user notification criteria and is therefore a notifiable alert. A further receiving component 330 may receive from an activity tracker, such as activity tracker 140, data indicative of movement of a sensor or sensors of a device attached to or carried by a user and communicating with the activity tracker, and hence of user 105. A further determining component 340 may then determine during an elapsed time period whether or not movement of a sensor or sensors communicating with activity tracker 140, and by inference user 105, has deviated from a prior pattern of movement. If it determines that movement has deviated from the prior pattern, alert processor 160 takes no further action. If it determines that movement has not deviated from the prior pattern, alert processor 160 takes an action to alert user 105.

Alert processor 160 of device 110 may comprise decision logic to determine deviation from an expected pattern of movement of device 110. In one example, human behavioral motion patterns may be modelled by Lévy flights. More information may be found for example in "Lévy flights in human behavior and cognition" by Andrea Baronchelli and Filippo Radichi, Chaos, Solitons & Fractals, 56 (2013) 101-105, which is hereby incorporated herein by reference in its entirety. Identification of deviation from the standard pattern of movement is represented by detection of the jump condition. Embodied in the decision logic in this case is a mechanism to identify the jump condition of the Lévy flight. Detection of this before the elapse of a specified time after detection of a notifiable event causes the decision logic to suppress further action. Where there is no such detection, decision logic triggers such action to alert the user, such as to interrupt audio to the device user and relay an alert sound to the user as described above.

As described herein, embodiments of the invention provide a computer implemented method for controlling transmission of an alert to the user of a device providing audio. The method includes: detecting an event comprising an alert; determining that the alert meets user notification criteria and is therefore a notifiable alert; monitoring a movement sensor carried by the user during a time period after detection of the notifiable alert; determining during the time period whether movement of the sensor has deviated from a prior pattern of movement, a deviation being indicative of a user response to the alert; and either: if it is determined that, after the elapse of the time period, the movement of the sensor during the time period has not deviated from the prior pattern of movement, taking an action to alert the user to the detected notifiable alert; or if it is determined that, during the time period, the movement of the sensor has deviated from the prior pattern of movement, taking no such action.

The movement sensor may be a constituent part of the device providing audio. A further device may include the movement sensor and be operable for communicating signals indicative of movement to the device providing audio. The movement sensor may be an accelerometer. The movement sensor may be a wireless signal receiver operable for detecting changes in wireless signals indicative of movement of the receiver relative to a wireless signal source. The event may be a sound in the environment of the user. The event may be a signal from a device connectable via a communications network to the device providing audio. The action taken may be to interrupt audio from the device and replace it with an alert sound. The event may be a sound in the environment and a recording of this sound may be used as the alert sound.

Embodiments of the invention provide a device including computing components operable for performing the method, and a computer program product including a computer readable storage medium having a computer readable program stored in it, the computer readable program, when executed on a computing device, causing the device to perform the method.

It will be clear to a person skilled in the art that many improvements and modifications can be made to the foregoing example embodiments without departing from the scope of aspects of the present invention.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method of controlling transmission of an alert to a user of a device providing audio, the computer-implemented method comprising:
    playing audio for a user by the device providing audio;
    during the playing of the audio, detecting an event comprising an alert within an environment of the user;
    determining that the alert meets user notification criteria and is therefore a notifiable alert;
    determining, by modeling, a pattern of user movement prior to the notifiable alert;
    monitoring a movement sensor associated with the user during a time period after detection of the notifiable alert to determine user movement activity;

determining during the time period whether the user movement activity deviates from the pattern of user movement determined prior to the notifiable alert, a deviation being indicative of a change in movement of the user from the pattern of user movement in response to the alert within the environment, where the change in movement of the user is not a predetermined change in movement of the user;

based on determining the user movement activity during the time period has not deviated from the pattern of user movement, taking an action via the device providing audio to alert the user to the notifiable alert; and based on determining the user movement activity has deviated from the pattern of user movement, taking no action via the device providing audio to alert the user to the notifiable alert.

2. The computer-implemented method of claim 1, wherein the movement sensor is a constituent part of the device providing audio.

3. The computer-implemented method of claim 1, wherein a further device comprises the movement sensor and is operable for communicating signals indicative of movement to the device providing audio, the further device being separate from the device providing audio.

4. The computer-implemented method of claim 1, wherein the movement sensor comprises an accelerometer.

5. The computer-implemented method of claim 1, wherein the movement sensor comprises a wireless signal receiver operable to detect changes in wireless signals indicative of movement of the wireless signal receiver relative to a wireless signal source.

6. The computer-implemented method of claim 1, wherein the event comprises a sound in the environment of the user, the sound being initiated by a person at a door of the environment.

7. The computer-implemented method of claim 1, wherein the event comprises a signal from a device in the environment of the user connectable via a communications network to the device providing audio.

8. The computer-implemented method of claim 1, wherein the action taken is to interrupt the audio from the device and replace it with an alert sound.

9. The computer-implemented method of claim 8, wherein the event comprises a sound in the environment and a recording of this sound is used as the alert sound.

10. A device for providing audio to a user and for controlling transmission of an alert to the user, the device comprising:
a sensor to detect an event comprising an alert; and
a processor coupled to the sensor and configured to perform a method, the method comprising:
playing audio for a user by the device;
during the playing of the audio, detecting an event comprising an alert within an environment of the user;
determining that the alert meets user notification criteria and is therefore a notifiable alert;
determining, by modeling, a pattern of user movement prior to the notifiable alert;
monitoring a movement sensor associated with the user during a time period after detection of the notifiable alert to determine user movement activity;
determining during the time period whether the user movement activity deviates from the pattern of user movement determined prior to the notifiable alert, a deviation being indicative of a change in movement of the user from the pattern of user movement in response to the alert within the environment, where the change in movement of the user is not a predetermined change in movement of the user;
based on determining the user movement activity during the time period has not deviated from the pattern of user movement, taking an action via the device providing audio to alert the user to the notifiable alert; and
based on determining the user movement activity has deviated from the pattern of user movement, taking no action via the device providing audio to alert the user to the notifiable alert.

11. The device of claim 10, wherein the movement sensor is a constituent part of the device providing audio.

12. The device of claim 10, wherein a further device comprises the movement sensor and is operable for communicating signals indicative of movement to the device providing audio, the further device being separate from the device providing audio.

13. The device of claim 10, wherein the movement sensor comprises an accelerometer.

14. The device of claim 10, wherein the movement sensor comprises a wireless signal receiver operable to detect changes in wireless signals indicative of movement of the receiver relative to a wireless signal source.

15. The device of claim 10, wherein the sensor to detect the event comprises a microphone, and the event comprises a sound in the environment of the user.

16. The device of claim 10, wherein the sensor to detect the event comprises a communications signal observer, and the event comprises a signal from a device in the environment of the user connectable via a communications network to the device providing audio.

17. The device of claim 10, wherein the action taken is to interrupt the audio from the device and replace it with an alert sound.

18. The device of claim 17, wherein the event comprises a sound in the environment and a recording of this sound is used as the alert sound.

19. A computer program product for controlling transmission of an alert to a user of a device providing audio, the computer program product comprising:
a computer readable storage medium readable by a processing circuit and storing instructions for execution by the processing circuit for performing a method comprising:
playing audio for a user by the device providing audio;
during the playing of the audio, detecting an event comprising an alert within an environment of the user;
determining that the alert meets user notification criteria and is therefore a notifiable alert;
determining, by modeling, a pattern of user movement prior to the notifiable alert;
monitoring a movement sensor associated with the user during a time period after detection of the notifiable alert to determine user movement activity;
determining during the time period whether the user movement activity deviates has deviated from the pattern of user movement determined prior to the notifiable alert, a deviation being indicative of a change in movement of the user from the pattern of user movement in response to the alert within the environment, where the change in movement of the user is not a predetermined change in movement of the user;

based on determining, the user movement activity during the time period has not deviated from the pattern of user movement, taking an action via the device providing audio to alert the user to the detected notifiable alert; and based on determining, the user movement activity has deviated from the pattern of user movement, taking no action via the device providing audio to alert the user to the notifiable alert.

20. The computer program product of claim 19, wherein the action taken is to interrupt the audio from the device and replace it with an alert sound.

* * * * *